(12) United States Patent
Yang

(10) Patent No.: US 8,562,178 B2
(45) Date of Patent: Oct. 22, 2013

(54) PASSIVE HEAT RADIATOR AND STREETLIGHT HEAT RADIATING DEVICE

(76) Inventor: Hongwu Yang, Dalian (CN)

( * ) Notice: Subject to any disclaimer, the term of this patent is extended or adjusted under 35 U.S.C. 154(b) by 970 days.

(21) Appl. No.: 12/410,398

(22) Filed: Mar. 24, 2009

(65) Prior Publication Data

US 2009/0314470 A1 Dec. 24, 2009

(30) Foreign Application Priority Data

Jun. 24, 2008 (CN) .......................... 2008 1 0115474
Nov. 13, 2008 (CN) .......................... 2008 1 0176467

(51) Int. Cl.
 *F28F 7/00* (2006.01)
(52) U.S. Cl.
 USPC .......... 362/294; 362/431; 165/185; 165/80.3; 165/104.33
(58) Field of Classification Search
 USPC .............. 362/294, 373, 547, 218, 345, 264; 165/185, 80.3, 104.33
 See application file for complete search history.

(56) References Cited

U.S. PATENT DOCUMENTS

| | | | | | |
|---|---|---|---|---|---|
| 3,226,602 | A | * | 12/1965 | Elfving .......................... | 361/700 |
| 4,588,023 | A | * | 5/1986 | Munekawa ............... | 165/104.33 |
| 5,076,351 | A | * | 12/1991 | Munekawa et al. ...... | 165/104.21 |
| 7,650,931 | B2 | * | 1/2010 | Siu ............................ | 165/104.26 |
| 2003/0056942 | A1 | * | 3/2003 | Ota et al. .................. | 165/104.33 |
| 2005/0061486 | A1 | * | 3/2005 | Yang ......................... | 165/104.33 |
| 2006/0250800 | A1 | * | 11/2006 | Chang et al. .................. | 362/294 |
| 2007/0230184 | A1 | * | 10/2007 | Shuy .............................. | 362/294 |
| 2007/0285926 | A1 | * | 12/2007 | Maxik ........................... | 362/294 |
| 2008/0007954 | A1 | * | 1/2008 | Li ................................. | 362/294 |

OTHER PUBLICATIONS

Thermacore Thermal Management Solutions, "Enabling your Next Generation Products with High-Performance Thermal Management Technologies", 2010, p. 2.*

Queheillalt et al., "A multifunctional heat pipe sandwich panel structure", International Journal of Heat and Mass Transfer, 2008, Elsevier, vol. 51, pp. 312-317.*

* cited by examiner

*Primary Examiner* — Jong-Suk (James) Lee
*Assistant Examiner* — Leah S Macchiarolo
(74) *Attorney, Agent, or Firm* — J.C. Patents

(57) ABSTRACT

The present invention relates to a passive heat radiator and a streetlight heat radiating device. The passive heat radiator includes: a heat radiating base plate; a slablike upstanding plate connected to the heat radiating base plate by soldering, and perpendicular to a horizontal plane when the heat radiating base plate is under a mounting status; a heat absorbing ending face disposed at one side of the heat radiating base plate deviated from the upstanding plate, and adapted to mount a heat generating element; and heat radiating fins connected to a surface of the upstanding plate by soldering, and perpendicular to the horizontal plane when the heat radiating base plate is under the mounting status. The heat radiating device includes a mounting seat and connecting seats. The heat absorbing ending face is provided with a bulb holder, or a circuit board is layout in the heat absorbing ending face, and connected with the streetlight bulb by soldering; the mounting seats are connected to the sides of the heat radiating base plate respectively; and the connecting seats are fixed and connected to the sides of the mounting seats. The present invention adopts an upstanding plate and heat radiating fins substantially perpendicular to a horizontal plane to form a heat radiating channel with a direction consistent with that of hot air flowing, which improves heat radiating effect.

11 Claims, 10 Drawing Sheets

PASSIVE HEAT RADIATOR AND STREETLIGHT HEAT RADIATING DEVICE

CROSS-REFERENCE TO RELATED APPLICATIONS

This application claims priority to Chinese Patent Application No. 200810115474.5, filed on Jun. 24, 2008 and 200810176467.6 filed on Nov. 13, 2008, entitled "PASSIVE HEAT RADIATOR AND STREETLIGHT HEAT RADIATING DEVICE". The contents of each of the above identified applications are incorporated herein by reference in its entirety.

FIELD OF THE INVENTION

The present invention relates to heat radiating technology, particularly to a passive heat radiator and a streetlight heat radiating device.

BACKGROUND

Due to large application of electrical energy, a wide range of electrical equipment has heat radiating problem in different extent. For example, common large-power light emitting diode (LED) streetlights. The node temperature of LED generally could not exceed a limit of 85□. When the node temperature of the LED exceeds 85□, the life of the LED will correspondingly reduce 50% as the node temperature exceeds 5□ every time and brightness of the LED streetlight will decay to 50% per half year. Therefore, a streetlight heat radiating problem how to transfer the heat generated by the LED node into environment has become a key issue to extend life expectancy of the LED streetlight and delay brightness attenuation thereof.

In prior art, a commonly adopted LED streetlight heat radiating structure is a die-casting or extruded aluminum alloy heat radiator. As shown in FIG. 1, LED bulbs 1 are mounted on bulb holders 2; an aluminum-alloy heat radiating base plate 3 is connected with the bulb holders 2 of the LED bulbs 1 by die casting; heat radiating fins 4 are perpendicularly connected on the heat radiating base plate 3. Normally, the heat radiating fins 4 are set to be extending outwards. In the process of implementing heat radiating, relying on metal thermal conductivity, heat generated by the LED bulbs 1 is transmitted via the bulb holders 2, the heat radiating base plate 3 and the heat radiating fins 4, and finally spread to the air. However, the aluminum alloy heat radiating structure has following defects: thermal conductivity coefficient of aluminum alloy is 100 W/MK; temperature decreases greatly in the distance where heat is transmitted; although this kind of heat radiator can be prepared with large superficial area, due to big thermal resistance of inner thermal conductivity, the heat radiator has a very small actually effective heat radiating area, which results in bad heat radiating effect.

Another LED streetlight heat radiating structure in prior art adopts a loop heat pipe (LHP) heat radiator. LHP is a typical linear heat conduction element. The heat radiating principle is shown as FIG. 2. Heat radiating working substance is filled into a heat radiating loop tube 100, contacts with the heat generating area of the electronic element at an evaporating end 110, absorbs heat, and is evaporated from liquid working substance into gaseous state. After that, the heat radiating working substance flows from the evaporating end 110 of the heat radiating loop tube 100 to the condensing end 130 under the action of the wick 120. During this process, the heat is transmitted to a bigger heat radiating surface and the heat radiating working substance is transformed from gaseous state back to liquid state and returns back to the evaporating end 110. When the LHP heat radiator is used as the LED streetlight heat radiating structure, the heat radiating loop tube is commonly disposed outside a lamp cap and the evaporating end of the heat radiating loop tube is usually layout at a heat source which is commonly at the top of the lamp cap. However, this kind of LHP heat radiating means also has the following problem: the heat radiating loop tube has small contacting area with the heat radiating area. and the contacting thermal resistance is large, as a result, a big effective extending heat radiating area can not be acquired and the heat radiating effect is undesirable.

SUMMARY

The main subject of the present invention is to provide a passive heat radiator so as to improve heat radiating efficiency of an electrical heat generating element.

The further subject of the present invention is to provide a streetlight heat radiating device so as to improve heat radiating effect of streetlights.

In order to accomplish the above subject, the present invention provides a passive heat radiator, including:
  a heat radiating base plate;
  a slablike upstanding plate connected to the heat radiating base plate by soldering, and perpendicular to a horizontal plane or having a first angle with the horizontal plane when the heat radiating base plate is under a mounting status;
  a heat absorbing ending face disposed at one side of the heat radiating base plate deviated from the upstanding plate, and adapted to mount a heat generating element; and
  heat radiating fins connected to a surface of the upstanding plate by soldering, and
  perpendicular to the horizontal plane or having a second angle with the horizontal plane when the heat radiating base plate is under the mounting status.

Specifically, the upstanding plate may be a metal solid panel or a plate-shaped heat pipe with a vapor chamber.

In order to accomplish the above subject, the present invention further provides a streetlight heat radiating device by adopting the passive heat radiator of the present invention. The streetlight heat radiating device further includes mounting seats and connecting seats, in which the heat absorbing ending face is provided with a bulb holder for mounting a streetlight bulb, or a circuit board is layout in the heat absorbing ending face, and connected with the streetlight bulb by soldering; the mounting seats are connected to the sides of the heat radiating base plate respectively; and the connecting seats are fixed and connected to the sides of the mounting seats deviated from the heat radiating base plate.

The passive heat radiator in the streetlight heat radiating device may be exposed to air for heat radiating, and may further includes a sealing cover covering at one side of the passive heat radiator where the upstanding plate and the heat radiating fins are disposed, in which the edge of the sealing cover is connected to the connecting seats and a plurality of wind inlet holes and wind outlet holes are further respectively opened on the sealing cover.

Specifically, the heat radiating base plate and the side of the mounting seat may be mutually inserted together through a groove and a projection, and may also be tightly connected by being pressed together.

It can be seen from the above technical solution, the present invention adopts a technical means that a heat radiating base plate, a slablike upstanding plate and heat radiating fins connected with each other by soldering to form a passive heat radiator so as to implement heat radiating, transmit heat to a two-dimensional plane for heat radiating, increase heat radiating area and improve heat radiating effect. Besides, when the heat radiating base plate is under a mounting status, the upstanding plate and the heat radiating fins are substantially perpendicular to a horizontal plane, which implements a status that the upstanding plate and the heat radiating fins are both substantially parallel to a gravity direction. Because air has a flowing trend that hot air rise up and cold air drops down, the direction of a channel for air flowing between the heat radiating fins and the upstanding plate is consistent with the direction of natural hot air flowing, which facilitates improving heat radiating effect. On the other hand, the heat radiating fins commonly disposed vertically can also play a role of guiding things such as rain water and dust flowing downwards to outside of the heat radiator.

FIG. 13 is a structure schematic view of Embodiment 1 of the streetlight heat radiating device in the present invention;

FIG. 14 is a structure schematic view of Embodiment 2 of the streetlight heat radiating device in the present invention;

FIG. 15 is a bottom view of the streetlight heat radiating device in FIG. 14;

FIG. 16 is a structure schematic view of Embodiment 3 of the streetlight heat radiating device in the present invention;

FIG. 17 is another cross sectional view of the passive heat radiator of Embodiment 1 in the present invention.

In figures:

| 1 bulb | 2 bulb holder | 3 heat radiating base plate |
| --- | --- | --- |
| 4 heat radiating fin | 11 housing | 12 heat absorbing ending face |
| 13 wick | 14 thermal conductivity supporting plate | 15 mounting seat |
| 16 connecting seat | 17 sealing cover | 20 reflecting plate |
| 21 heat radiating area | 22 lamp room area | 23 wind inlet hole |
| 24 wind outlet hole | 25 wind inlet draining sheet | 26 wind outlet draining sheet |
| 27 groove | 28 projection | 29 lamp cap |
| 100 heat radiating loop tube | 110 evaporating end | 120 wick |
| 130 condensing end | 31 dummy club | 32 mounting hole |
| 33 via hole | 34 bolt | 35 ventilation cleaning hole |

DETAILED DESCRIPTION

The present invention is described in detail below through embodiments accompanied with drawings.

Embodiment 1 of the Passive Heat Radiator

Figure 1:
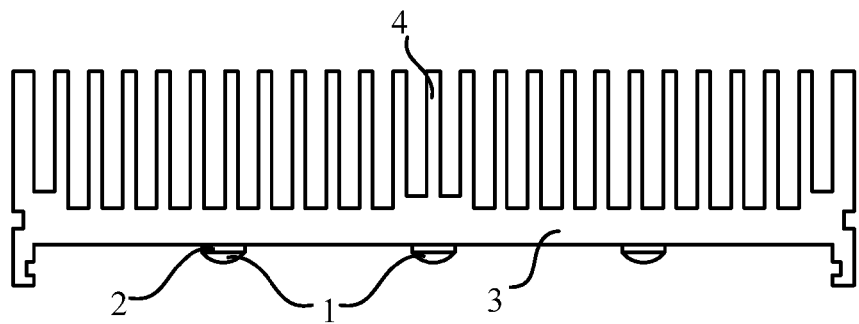
FIG. 1 is a structure schematic view of a streetlight heat radiating device in prior art.
Figure 2:
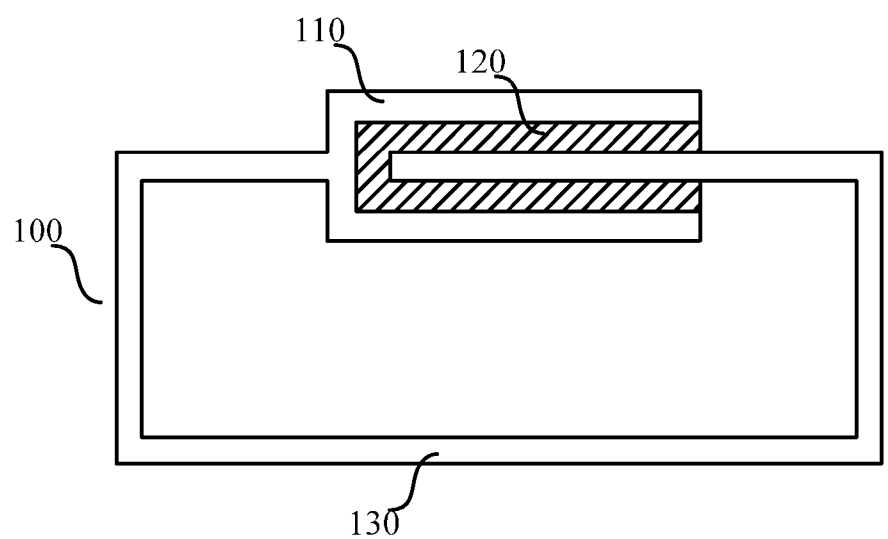
FIG. 2 is a principal schematic view of LHP heat radiating in prior art.
Figure 3:
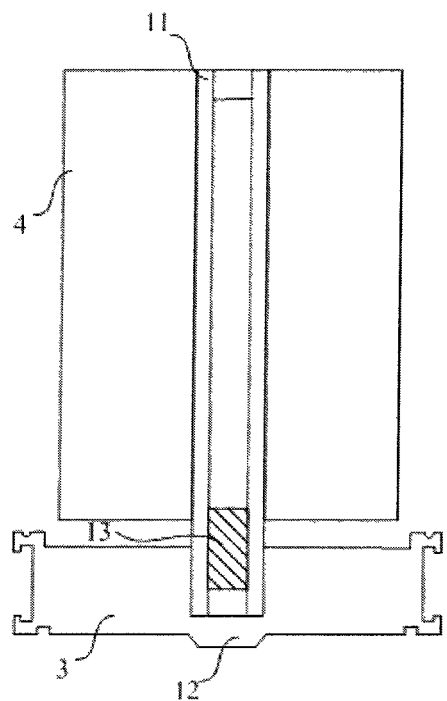
FIG. 3 is a cross sectional view of Embodiment 1 of the passive heat radiator in the present invention.
Figure 4:
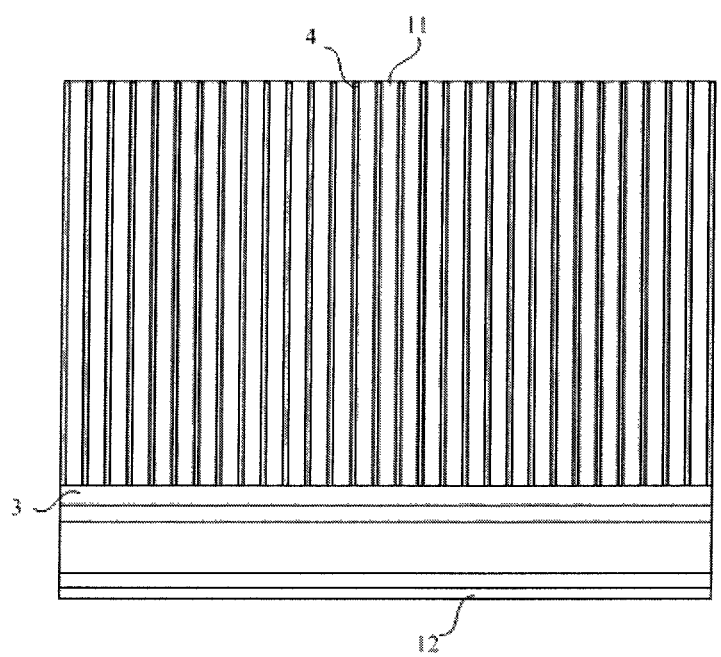
FIG. 4 is a side view of Embodiment 1 of the passive heat radiator in the present invention.

As shown in FIG. 3, is a cross sectional view of Embodiment 1 of the present invention passive heat radiator. FIG. 4 is a structure schematic side view of the Embodiment 1 of the present invention passive heat radiator. The passive heat radiator includes a heat radiating base plate 3, a housing 11 a heat absorbing ending face 12, a wick 13 and heat radiating fins 4. The heat radiating base plate 3 may be usually rectangular plate structure with a rectangular cross section. The slablike sealing housing 11 is usually has a rectangular surface and may be fixed and connected to the top surface of the heat radiating base plate 3 or partially embodied into the heat radiating base plate 3 vertically or in a certain angle by the way of brazing. Depending on requirement for heat radiating situations, there may be disposed one sealing housing 11 or multiple sealing housings 11 abreast. The inner cavity of the housing 11 is evacuated to vacuum during work and poured with liquid working substance having heat evaporation characteristics. Generally speaking, the housing 11 may be buckled by two panels; a plate frame is surrounded outside the panels for sealing and fixing the two panels; a pouring port may be further disposed on the plate frame of the housing 11 for pouring part or some liquid working substance. The heat absorbing ending face 12 is disposed on one side surface of the heat radiating base plate 3 deviating from the housing 11. The heat absorbing ending face 12 may be one or more and may be a planar surface or a lug boss or a notch for mounting or pasting a heat generating element, and absorbs heat from the heat generating element centrally. The above pouring port is preferably disposed far from the heat absorbing ending face 12. The wick 13 may be disposed in the housing 11 and on the inner wall of the housing 11, e.g. The wick 13 is fixed on the inner wall of the housing 11 by the way of soldering and disposed at the inner side of the housing 11 adjacent to the heat absorbing ending face 12 for collecting the liquid working substance to the bottom of the housing 11 through capillarity, i.e. collecting it to the heat absorbing ending face 12. The heat radiating fins 4 may be fixed and connected to the surface(s) at one side or two sides of the housing 11 by the way of soldering, preferably disposed perpendicularly to the surface of the housing 11. Furthermore, the heat radiating fins 4 may be perpendicular to the heat radiating base plate 3 and disposed at two sides of the housing 11 erectly. As shown in FIG. 4, when the heat radiating base plate 3 is under a mounting status, the heat radiating fins 4 are perpendicular to the horizontal plane. The heat radiating base plate 3 in the present embodiment is disposed horizontally under the mounting status so that the heat radiating fins 4 are perpendicular to the heat radiating base plate 3 each other.

Alternatively, heat radiating fins may also be parallel to the heat radiating base plate or be disposed in a certain angle or in a certain pattern which may be selected according to requirement of heat radiating environment as long as they can expand heat radiating area and guide cold air for circulation.

In the housing of the passive heat radiator according to the present embodiment, a supporting component may be further disposed. The supporting component may be specifically disposed in the inner cavity of the housing, fixed and connected to the inner surfaces of two panels of the housing by soldering, on one hand, adapted for supporting the wall of the housing so as to eliminate the impact of inward deformation caused due to the pressure generated by external atmosphere on the housing, on the other hand, adapted for pulling the wall of the housing tightly so as to eliminate the impact of outward deformation caused due to the pressure generated by vaporization of inner liquid working substance on the housing.

In specific practice, the wick and the supporting component may be disposed together. The wick may be a structure of welding film micro-channels group, may be a weaving net, strands, lines, a preset sintering structure of nets, silks and particles, or other wick with a preset structure. The supporting component may be a supporting structure made of sheet material through pressure processing or may be a reticular structure having supporting points at the top and bottom and having a large number of pores in the middle which are knitted by metal wires. The supporting component is connected with the inner wall of the housing through soldering. The supporting component may have capillarity of the wick through disposing a dense-honeycomb-shaped supporting component to guide the liquid working substance to flow to the heat absorbing ending face. The wick may also uses high-intensity material and is fixed and connected to the inner side of the housing so as to have the effect of capillarity and the effect of supporting and pulling tightly the housing concurrently. When prepared by techniques such as sintering, the wick may be only disposed at one end in the housing adjacent to the heat radiating base plate, and the supporting component may be disposed at the part in housing where no wick is disposed so as to avoid the impact of the wick on the fixing and connection between the supporting component and the side wall of the housing, and enable the supporting component to bear the force caused by inward and outward deformation of the housing.

The passive heat radiator according to the present embodiment makes use of a vapor chamber heat radiating principle and uses a phase transition process that heat is absorbed when liquid is evaporated and heat is released when steam is condensed to transmit vaporization latent heat. The specific process of heat radiating is as follows: the heat absorbing ending face may absorb heat from the heat generating element attached thereon; one end of the housing adjacent to the heat absorbing ending face is the evaporating end where the liquid working substance absorbs heat, is evaporated into gaseous state, and spread within all over the housing gradually; a part in the housing far from the heat absorbing ending face may be called the condensing end; the outer side of the condensing end of the housing is connected with heat radiating fins or directly contacts with cold air; when the working substance in gaseous state spreads to the condensing end, heat spreads to air via the wall of the housing directly or indirectly via heat radiating fins; after the working substance in gaseous state is condensed into liquid, the liquid flows back; the wick disposed at the inner side of the housing adjacent to the heat absorbing ending face may attract the liquid working substance by capillarity and collect it into the wick, i.e. collect the working substance to the place adjacent to the heat absorbing ending face for the next heat radiating circulation.

In the present embodiment, a heat plate constructed by the sealing housing is preferably disposed in a direction parallel to the gravity direction, that is, when the heat radiating base plate is under the mounting status, the heat plate can be perpendicular to the horizontal plane so as to be parallel to the gravity direction. Alternatively, when the heat radiating base plate is under the mounting status, the plane where the heat plate is located may have a first angle with the horizontal plane. The first angle is preferably greater than 60 degrees so that the heat plate has a small angle with gravity direction for accommodating a flowing direction of cold and hot air convection to some extent.

In the present embodiment, the heat radiating fins are also preferably disposed in a direction parallel to the gravity direction, that is, when the heat radiating base plate is under the mounting status, the heat radiating fins can be perpendicular to the horizontal plane so as to be parallel to the gravity direction. Alternatively, when the heat radiating base plate is under the mounting status, the heat radiating fins may also have a second angle with the horizontal plane and the second angle is preferably greater than 60 degrees so that the heat radiating fins have a small angle with gravity direction for accommodating a flowing direction of cold and hot air convection to some extent.

Because the heat radiating base plate in the present embodiment is disposed horizontally when it is under the mounting status, the heat plate, the heat radiating base plate and the heat radiating fins are soldered together mutually perpendicular to each other. According the principal that hot air rises up and cold air falls down, the direction of a channel for air flowing between the heat radiating fins and the upstanding plate can be consistent with the direction of cold and hot air convection, and can also be the same as the transmitting direction of the heat in the heat plate, which facilitates improving the heat radiating effect, and at the same time, the heat radiating fins commonly disposed vertically can also play an role of guiding things such as rain water and dust flowing downwards to the outside of the heat radiator.

In the passive heat radiator according to the present embodiment, the sealing housing filled with the liquid working substance is a plate-shaped heat plate structure which utilizes a two-dimensional plane phase change heat transmitting structure of the plate-shaped housing to evenly transmit the heat absorbed from the heat generating element to all over the heat plate surface, and transmit the heat to the cold air contacting with the heat radiating fins via the metal heat radiating fins fixed on the heat plate surface by soldering, which implements the passive heat radiating. The heat plate with a two-dimensional plane have large heat radiating area and the heat radiating performance is far superior to the heat radiating performance of a tube-shaped heat pipe. At the same time, the structure of the heat plate makes it different to a heat pipe in terms of bearing the impact on housing deformation caused by inner positive pressure and negative pressure of the housing. The heat pipe represents a more obvious housing deformation tendency. In the present embodiment, the supporting component disposed within the heat plate housing can effectively solve this problem. The passive heat radiator according to the present embodiment has a higher heat radiating efficiency, simple structure, and low cost, which is easy to be promoted and realized.

Embodiment 2 of the Passive Heat Radiator

Figure 5:
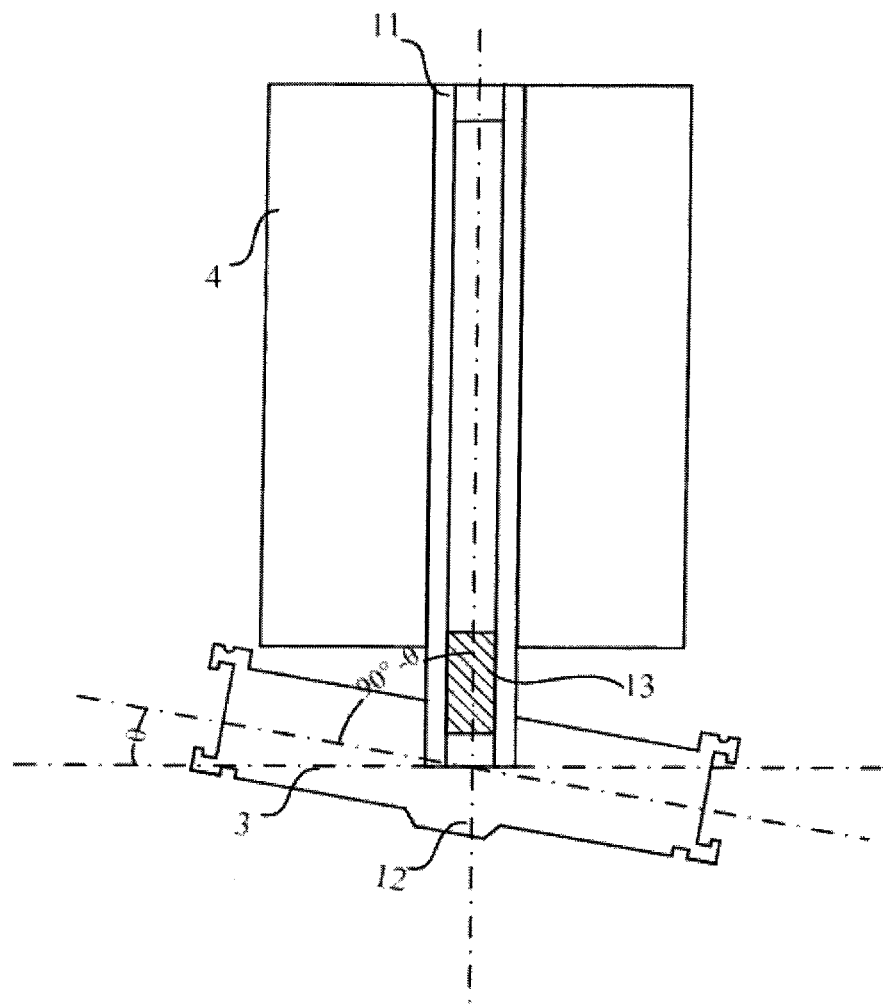
FIG. 5 is a structure schematic view of Embodiment 2 of the passive heat radiator in the present invention.

As shown in FIG. 5, it is a structure schematic view of Embodiment 2 of the passive heat radiator in the present invention. Compared with the Embodiment 1, the present embodiment has the following differences: when the heat radiating base plate 3 is under the mounting status, it has an angle θ with the horizontal plane, thus the housing 11 correspondingly has an angle 90°-θ with the heat radiating base plate 3 which enable the housing 11 to keep parallel to the gravity direction as the heat radiating base plate 3 is being mounted.

Embodiment 3 of the Passive Heat Radiator

Figure 6:
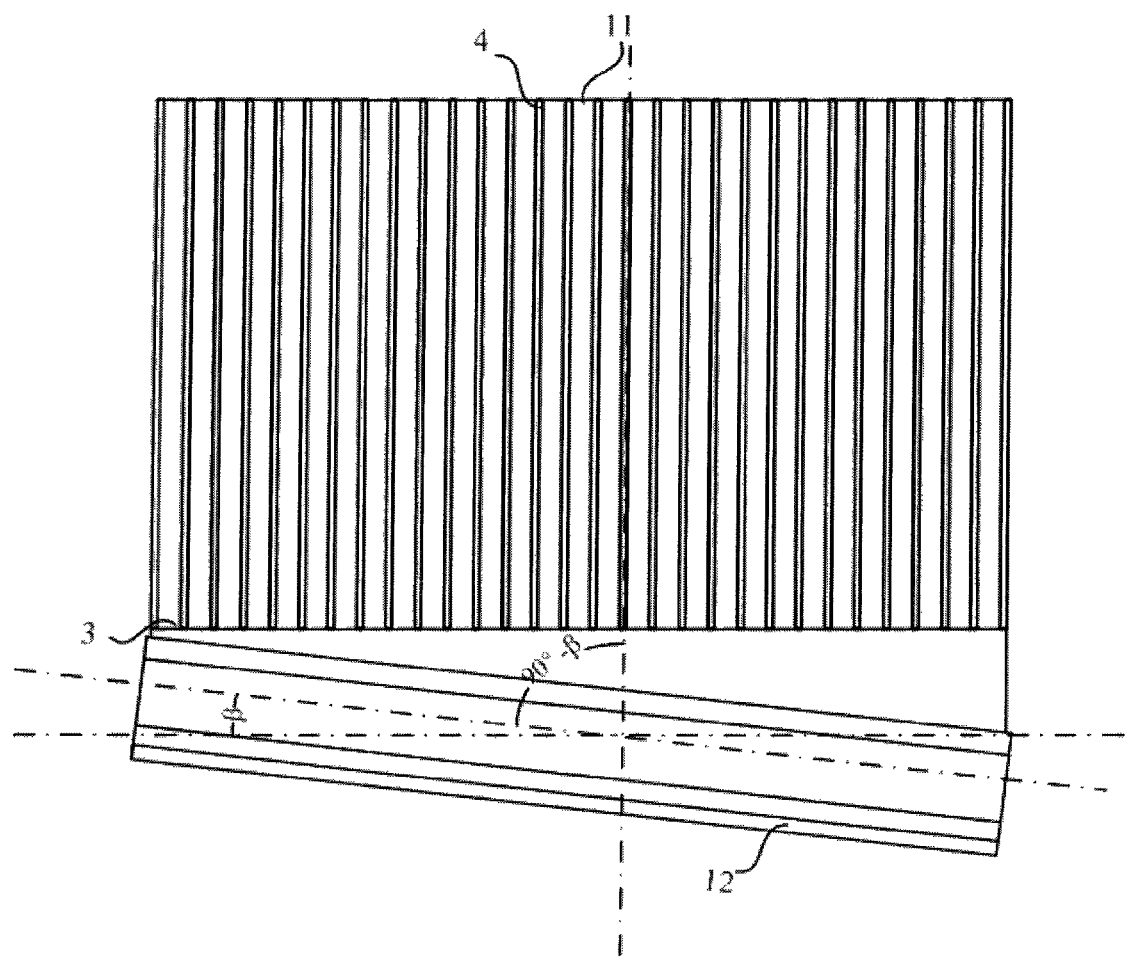
FIG. 6 a structure schematic view of Embodiment 3 of the passive heat radiator in the present invention.

As shown in FIG. 6, it is a structure schematic view of Embodiment 3 of the passive heat radiator in the present invention. Compared with the Embodiment 1, the present embodiment has the following differences: when the heat radiating base plate 3 is under the mounting status, it has an angle β with the ground plane, thus the heat radiating fins 4 corresponding has an angle 90°-β with the heat radiating base plate 3 which enables heat radiating fins 4 to still keep parallel to the gravity direction as the heat radiating base plate 3 is being mounted.

In the above passive heat radiator in Embodiments 2 and 3, the heat radiating base plate is not parallel to the ground plane when it is under the mounting status. In such a case, the heat plate and the heat radiating fins can keep parallel to the gravity direction as they are mounted through changing relative position relationship between the heat radiating fins or the housing and the heat radiating base plate.

Embodiment 4 of the Passive Heat Radiator

Figure 7:
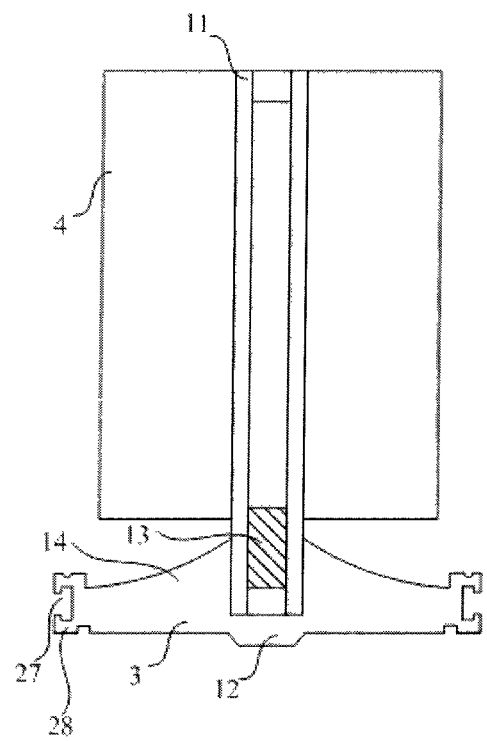
FIG. 7 is a cross sectional view of the first implementing way of Embodiment 4 of the passive heat radiator in the present invention.

As shown in FIG. 7, it is a cross sectional view of the first implementing way of Embodiment 4 of the passive heat radiator in the present invention. Compared with the Embodiment 1, the present embodiment has the following differences: the cross section shape of the heat radiating base plate 3 is approximate isoscelestriangle. The specific shape is shown in FIG. 7. Two sides of the approximate isoscelestriangle are arc recessed to inside. This shape may also be called saddle shape. The top angle of the approximate isoscelestriangle is connected with a bottom end of the housing 11; bottom ends of the heat radiating fins 4 are flush with the point of the top angle of the approximate isoscelestriangle, that is, a gap for ventilation is formed between the two sides of the approximate isoscelestriangle and the heat radiating fins 4 so as to facilitate cold air flowing between the heat radiating fins 4 and the heat radiating base plate 3, and form circularly fluid flow between the heat radiating fins 4. In addition, for the passive heat radiator used by exposure to external environment, the gap can also facilitate draining things such rain water and dust and being cleaned.

The saddle-shaped heat radiating base plate 3 may be molded integratively or formed by fixing and connecting a saddle-shaped thermal conductivity supporting plate 14 and a planar plate by way of soldering. As shown in FIG. 7, the thermal conductivity supporting plate 14 is soldered out of two sides of the housing 11 where has the wick 13, which can increase the contacting area between the heat radiating base plate 3 and the evaporating end in the heat plate. The curve at two sides of the saddle can guide the heat in the planar plate at the bottom of the heat radiating base plate 3 into the wick 13 in the housing 11 and strengthen heat radiating effect.

Figure 8:
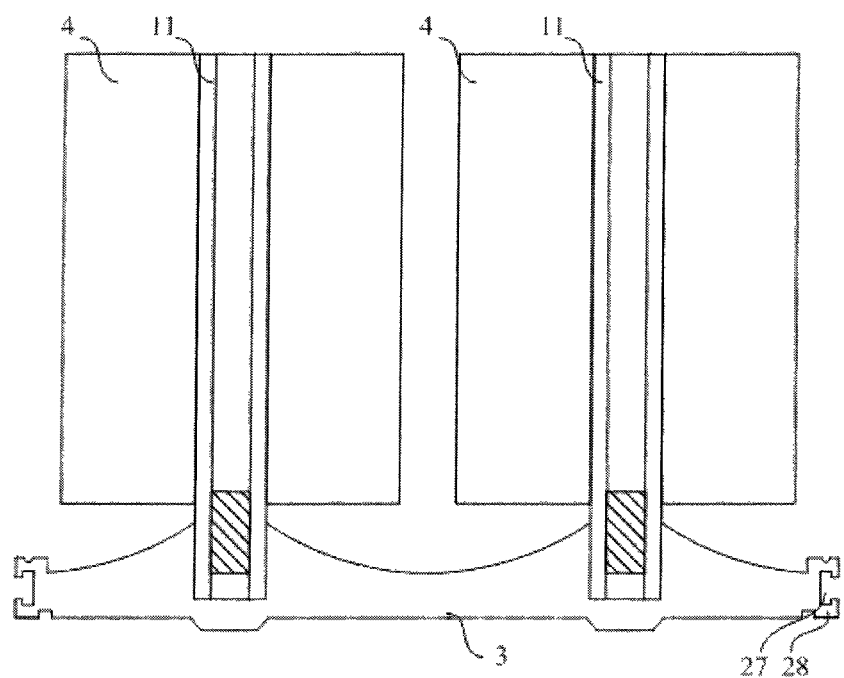
FIG. 8 is a cross sectional view of the second implementing way of Embodiment 4 of the passive heat radiator in the present invention.
Figure 9:
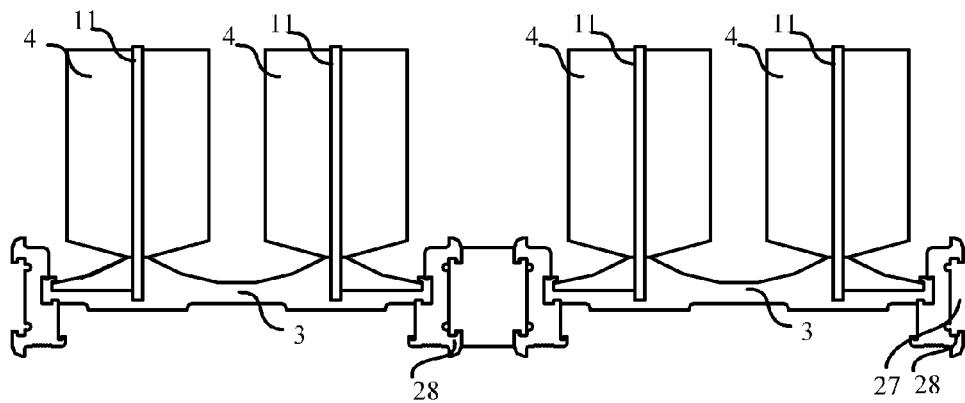
FIG. 9 is a cross sectional view of the third implementing way of Embodiment 4 of the passive heat radiator in the present invention.
Figure 10:
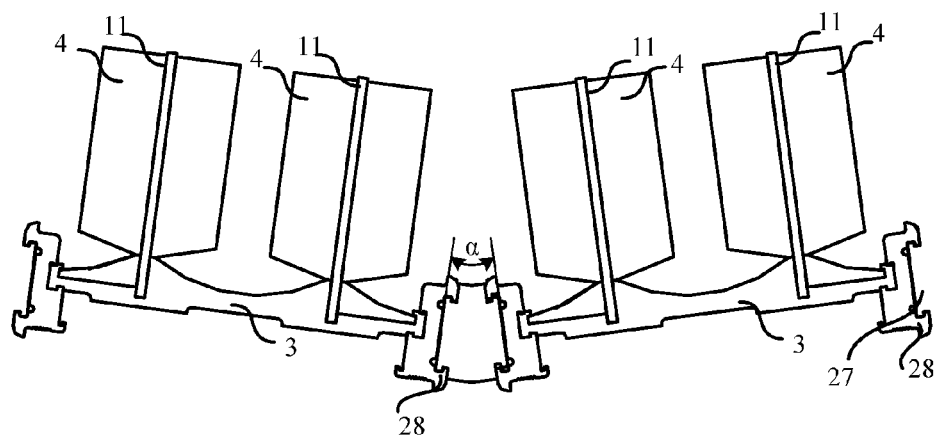
FIG. 10 is a cross sectional view of the fourth implementing way of Embodiment 4 of the passive heat radiator in the present invention.
Figure 11:
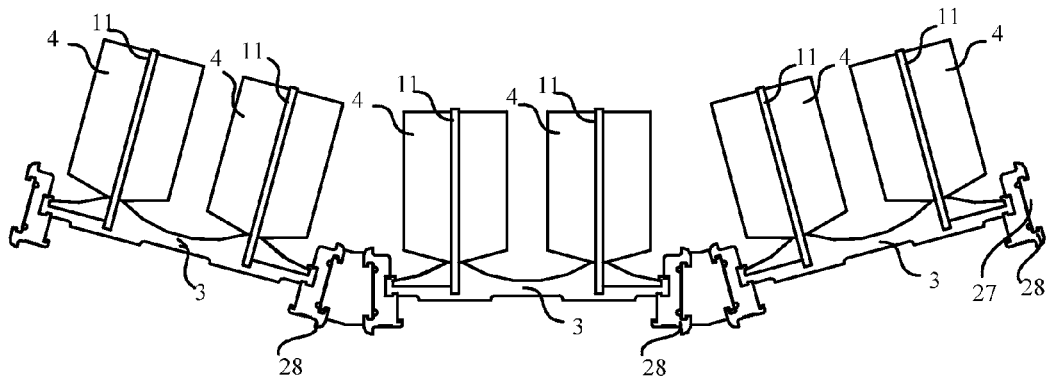
FIG. 11 is a cross sectional view of the fifth implementing way of Embodiment 4 of the passive heat radiator in the present invention.
Figure 12:
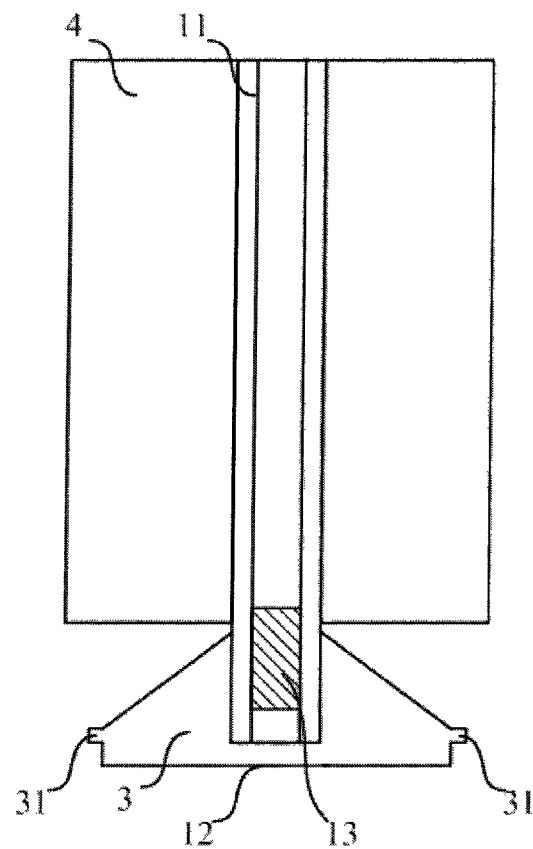
FIG. 12 is a cross sectional view of the sixth implementing way of Embodiment 4 of the passive heat radiator in the present invention.

In practical application, regarding the passive heat radiator of the present embodiment, there may be many kinds of cross section shapes of the heat radiating base plate 3 such as isoscelestriangle. As shown in FIG. 8, it shows a heat radiating base plate 3 with two saddle-shaped cross sections connected. The heat plate housings 11 and the heat radiating fins 4 thereof are respectively disposed at the top end of two saddle-shaped. A groove 27 and/or a projection 28 which can be mutually engaged by concave and convex with a connecting attachment may further be disposed at two sides of the heat radiating base plate 3, as shown in FIGS. 7 and 8, so as to conveniently connect two passive heat radiators via the connecting attachment. For example, as shown in FIGS. 9, 10 and 11, they are schematic views of connecting status of multiple passive heat radiators. FIG. 9 shows a structure that the two passive heat radiators shown in FIG. 8 are connected side by side in parallel through the connecting attachment. FIG. 10 shows a structure that the two passive heat radiators shown in FIG. 8 are connected side by side and forming a certain angle α. FIG. 11 shows a structure that the three passive heat radiators shown in FIG. 8 are connected side by side and forming a certain angle. In specific implementation, when the mounting position of the heat radiating base plate is not parallel to the horizontal plane, the passive heat radiators in FIG. 5 or 6 may also be combined with each other according to the specific situations. In order to implement the connection with the certain angle, a special connecting attachment may be disposed to be connected with the same passive heat radiators. The angle formed between the passive heat radiators may be determined by the connecting attachment, i.e. determined by the angle α between the grooves on the connecting attachment for connecting passive heat radiators. Alternatively, dummy clubs 31 may be disposed at two sides of the heat radiating base plate 3, as shown in FIG. 12, which is adapted to embody the passive heat radiator into the device which needs heat radiating. The above technical solution may implement handy assembly through setting the passive heat radiators to be standardized components so as to accommodate a variety of heat radiating requirement and passive heat radiator mounting requirement. The passive heat radiator bases on the passive heat radiating principal of a two-dimensional plane heat plate and may be mounted onto various heat generating devices by being mounted or attached into the heat generating element for heat radiating.

Embodiment 5 of the Passive Heat Radiator

Embodiment 5 of the passive heat radiator in the present invention may be based on the above embodiments with the following difference: a metal solid panel may be used to substitute the heat plate constructed by the sealing housing to form a slablike upstanding plate. The upstanding plate is connected to the heat radiating base plate by soldering. When the heat radiating base plate is under the mounting status, the upstanding plate is perpendicular to the horizontal plane or has a first angle with the horizontal plane. The first angle is preferably greater than 60 degrees so as to keep the upstanding plate has a small angle with the gravity direction. The heat absorbing ending face is disposed at one side of the heat radiating base plate deviated from the upstanding plate. The heat radiating fins are connected to one side surface or two side surfaces of the upstanding plate by soldering, preferably disposed perpendicular to the surface of the upstanding plate, and perpendicular to the horizontal plane or having a second angle with the horizontal plane when the heat radiating base plate is under the mounting status. The second angle is preferably greater than 60 degrees and keeps a small angle between the heat radiating fins and the gravity direction.

The technical solution of the present embodiment makes the air flow channel direction formed between the upstanding plate and each heat radiating fins consistent with the direction of cold and hot air convection by designing a relative position relationship of the upstanding plate, heat radiating base plate and the heat radiating fins so as to form convection circulation and improve heat radiating effect. The specific form of the upstanding plate is not only limited to the above mentioned plate-shaped heat pipe or metal solid panel, but it may also be selected from other plate-shaped heat radiating bodies with good heat radiating performance according to specific situations.

Embodiment 1 of the Streetlight Heat Radiating Device

Figure 13:
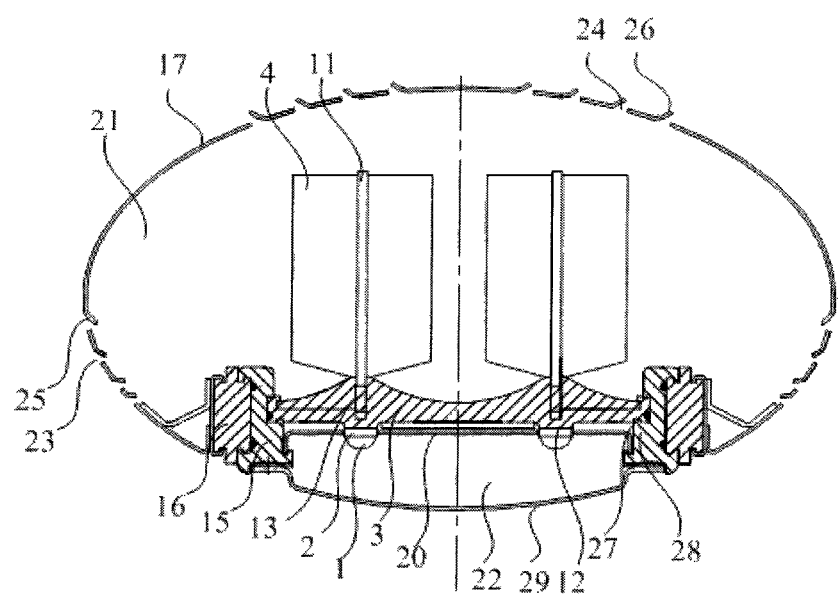

As shown in FIG. 13, it is a structure schematic view of Embodiment 1 of the streetlight heat radiating device in the present invention. The streetlight heat radiating device may adopt the passive heat radiator of the present invention as the heat radiating structure. The passive heat radiator specifically includes: a heat radiating base plate 3, a slablike sealing housing 11 fixedly connected to the heat radiating base plate 3 by soldering, in which the cavity in the housing 11 is vacuum and is poured with liquid working substance having heat evaporation characteristics; a heat absorbing ending face 12 disposed at one side of the heat radiating base plate 3 deviated from the housing 11 and adapted to mount a heat generating element; a wick 13 disposed in the housing 11 and disposed at the inner side of the housing 11 adjacent to the heat absorbing ending face 12; and heat radiating fins 4 fixedly connected to the surface of the housing 11 by soldering and preferably disposed perpendicular to the surface of the housing 11. Besides, when the heat radiating base plate 3 is under the mounting status, the housing 11 is preferably perpendicular to the horizontal plane or has a first angle with the horizontal plane, and the heat radiating fins 4 are perpendicular to the horizontal plane or have a second angle with the horizontal plane. In the present embodiment, the heat radiating base plate 3 is disposed horizontally when it is under the mounting status, accordingly the housing 11, the heat radiating fins 4 and the heat radiating base plate 3 are perpendicular between each other. Based on the above structures, the streetlight heat radiating device further includes mounting seats 15, connecting seats 16 and a sealing cover 17. The heat absorbing ending face 12 is provided with a bulb holder 2 for mounting a streetlight bulb 1 so as to make the heat generating element bulb 1 adjoin the heat absorbing ending face 12, i.e. adjoin the wick 13 for acquire a desirable heat radiating effect. The heat radiating base plate 3 and the mounting seat 15 are respectively provided with a groove 27 and/or a projection 28 at sides thereof which are engaged and hooked together by concave and convex. As shown in FIG. 13, mounting seats 15 are connected to two sides of one heat radiating base plate 3 via the groove 27 and/or projection 28. The side of the mounting seat 15 deviated from the heat radiating base plate 3 is fixed and connected to the connecting seat 16. Specifically, this connection may be implemented by screwing, soldering, bonding, mechanical extrusion or the groove 27 and/or projection 28 engaged and inserted by concave and convex. The sealing cover 17 covers at one side of passive heat radiator where the housing 11 and the heat radiating fins 4 are disposed, and the edge of the sealing cover 17 is connected with the connecting seats 16 so as to form a heat radiating area 21 above the heat radiating base plate 3. There are further many wind inlet holes 23 and wind outlet holes 24 opened on the sealing cover 17 in a shape of rectangular or circular, which can ensure air flowing in the heat radiating area 21.

In the present embodiment, the wind inlet holes 23 may be disposed at the side of the sealing cover 17 adjacent to the connecting seats 16 respectively; the wind outlet holes 24 may be disposed on top of the sealing cover 17 adjacent to the top end of the housing 11. Setting the positions of the wind inlet holes 23 and wind outlet holes 24 facilitates hot air flowing out from the top end and cold air flowing into the bottom side so as to form air circulation in the heat radiating area 21. Further more, wind inlet draining sheets 25 may be further disposed at the edges of wind inlet holes 23. The wind inlet draining sheets 25 are disposed at the inner sides of the sealing cover 17 and extend downwards from up edges of the wind inlet holes 23. Wind outlet draining sheets 26 may be further disposed at the edges of the wind outlet holes 24. The wind outlet draining sheets 26 are disposed at the outer side of the sealing covers 17 and extend outwards from the edges of the wind outlet holes 24 by taking the central line of the sealing cover 17 as symmetry axis. The disposed wind inlet draining sheets 25 and wind outlet draining sheets 26 can guide flowing direction of air so as to strengthen air circumfluent effect in the heat radiating area 21.

In the above embodiments, the heat radiating base plate is provided with a groove and/or projection at two sides thereof. Specifically at least two groups of grooves and/or projections may be disposed at each side. The shape of the groove and/or projection may be T-shaped, rectangular-shaped or swallow-tailed. They are engaged and inserted to the corresponding side of the mounting seat together. The streetlight heat radiating device of the present embodiment may include multiple passive heat radiators connected with each other through connecting to the mounting seats. The above streetlight heat radiating device may implement standardization for convenient assembly so as to acquire a streetlight heat radiating device group to provide a heat radiating structure for streetlight with different power. The technical solution is high flexible and easy to assembly, accommodates streetlights with different heat radiating requirements by assembling standardized heat radiating devices, and implements power combination of multiple groups of streetlights to accommodate requirements of specific situations. By adopting mounting seats in different shapes or setting different angles between the grooves and/or projections at two sides of the mounting seat, angle configuration between multiple passive heat radiators can be realized.

The streetlight heat radiating device of the present embodiment may further adopt the passive heat radiator in any embodiment of the present invention, further include a supporting component, and adopt a heat absorbing ending face in form of lug boss or notch so as to embody the bulb holder into the heat radiating base plate, which facilities direct heat radiating. The present embodiment can utilize a two-dimensional plane phase change heat transmitting structure of the heat plate to evenly transmit the heat absorbed from the streetlight bulb to the heat plate surface and then transmit the heat to the cold air via the metal heat radiating fins soldered on the heat plate surface so as to implement the passive heat radiating. The heat plate of the passive heat radiator in the present embodiment streetlight heat radiating device may also be substituted by a metal solid panel as an upstanding plate. By keeping air channel direction between the upstanding plate and the heat radiating fins substantially consistent with cold air convection direction, convection circulation of cold and hot air is formed so as to strengthen heat radiating effect.

In the above specific embodiments of the streetlight heat radiating device, as shown in FIG. 13, a lamp cap 29 may further be fixed and connected to the mounting seat 15 and covers on one side where a bulb holder 2 is disposed. A lamp room area 22 is formed between the lamp cap 29 and the bottom surface of the heat radiating base plate 3. A reflecting plate 20 and a circuit board may be further attached at one side of the heat radiating base plate 3 where a heat absorbing ending face 12 is disposed. The edge of the reflecting plate 20 is fixed and connected to the mounting seats 15. Reflecting plates 20 are disposed between the bulb holders 2 at intervals to play a role of reflecting lights and increasing brightness when the streetlights mounted on the bulb holders 2 give off lights.

In order to realize sealing of the above lamp room area and isolation of the heat radiating area, a sealing groove may be disposed at a place where the mounting seat and the connecting seat are connected. Sealing rings are layout in the sealing groove so as to prevent the circuit board mounted in the lamp room area for driving on-off of the streetlight bulbs from exposure to humid external environment and damage caused by moisture to electrical appliance. In order to facilitate overall installation of the streetlights, screw holes or positioning bolts may be further disposed at center of the heat radiating base plate and/or connecting seats. At the bottom of the heat radiating base plate, an outlet for draining rain water and dust may be further disposed at the position corresponding to the edge of the lamp cap.

The mounting seat and the connecting seat may be molded integratively or be manufactured separately. For example, for the situation that multiple streetlight bulbs are mounted, the number of the passive heat radiators may be at least two, and the number of the mounting seats is one more than that of the passive heat radiators for being connected between the passive heat radiators and being connected between the passive heat radiator and the connecting seat so as to flexibly expand heat radiating ability of the passive heat radiator according to specific requirements. Further more, an angle may be further formed between two sides of the mounting seat where is connected with the heat radiating base plate to form an angle between two passive heat radiators connected to the mounting seat so as to accommodate streetlights in different shapes.

The mounting seat and the heat radiating base plate may also be casted integratively or manufactured separately. When the mounting seat and heat radiating base plate are manufactured separately, they can be prepared by using different material. Material with good heat radiating performance is used to prepare the heat radiating base plate for improving heat radiating performance, bringing down heat radiating requirement to material of the mounting seat, reducing weight, and cutting cost. The separately manufacturing also facilitates flexibly selecting other forms of mounting seat. The mounting seats may be used to combine multiple groups of passive heat radiators, which facilitate providing a suitable heat radiating structure for combining LED streetlights and accommodating light matching angles of multiple groups of LED streetlights multiple groups of LED streetlights.

Embodiment 2 of the Streetlight Heat Radiating Device

Figure 14:
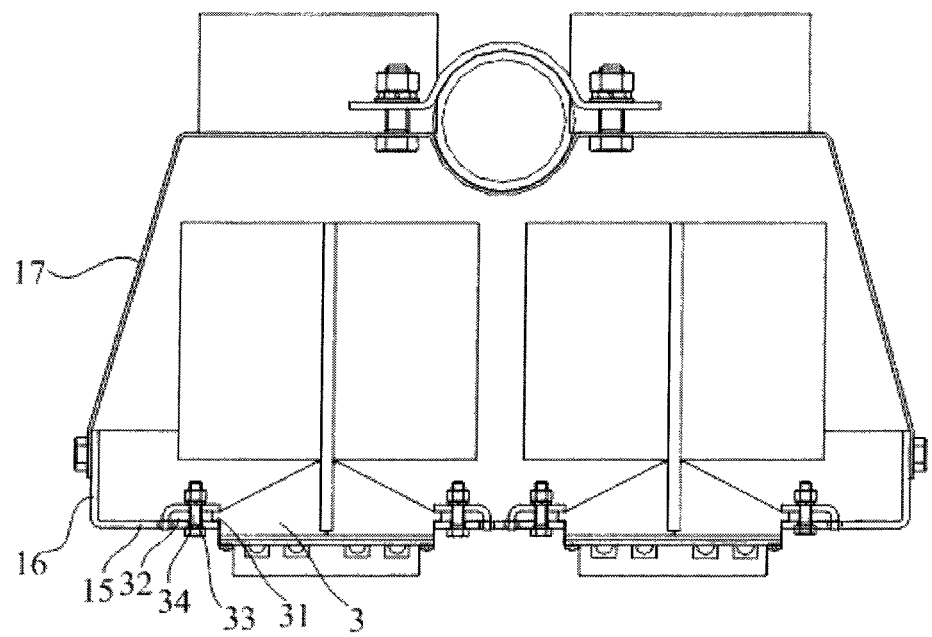

As shown in FIG. 14, it is a structure schematic view of Embodiment 2 of the streetlight heat radiating device in the present invention. The present embodiment is similar to the Embodiment 1 with following difference: the passive heat radiator is connected with the streetlight housing by way of compression jointing. The streetlight heat radiating device may adopt the passive heat radiator of the present invention and further include mounting seats 15, connecting seats 16 and a sealing cover 17. The sealing cover 17 as the streetlight housing is specifically formed by stamping sheet metal. The sides of the connecting seats 16 may be connected with the bottom edge of the sealing cover 17 by a bolt structure etc. The mounting seat 15 and the connecting seat 16 are specifically formed by stamping integratively. A mounting hole 32 is formed by coining in advance at the side of the mounting seat 15 where the passive heat radiator is to be mounted. In the passive heat radiator, a dummy club 31 is disposed at the side of the heat radiating base plate 3 and is embedded into the mounting hole 32 when assembling. Two side surfaces of the mounting hole 32 may be tightly compression jointed on the outer surface of the dummy club 31 so as to fix and connect the passive heat radiator. Specifically, via holes 33 are perfoliately opened on two side surfaces of the mounting hole 32. When assembling, bolts 34 are inserted into the via holes 33 at two sides. The bolts 34 are tightened to make the two side surfaces of the mounting hole 32 pressing tightly onto the dummy club 31. A gasket may be further disposed between the side surfaces of the mounting hole 32 and the outer surfaces of the dummy club 31. Restriction of the mounting holes 32 and tightening of the bolts 34 can confine the position of the heat radiating base plate 3 in three-dimensional space. As shown in FIG. 14, multiple passive heat radiators may be connected with each other through the mounting seats 15 to accommodate requirements of streetlight in different sizes.

Figure 15:
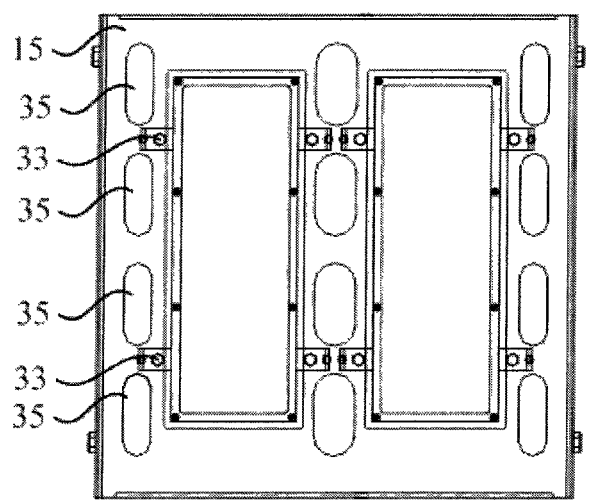

Based on the streetlight heat radiating devices of the present embodiment and the above Embodiment 1, ventilation cleaning holes 35 may be further perfoliately opened on the mounting seat 15 and/or connecting seat. As shown in FIG. 15, it is a bottom view of the streetlight heat radiating device in FIG. 14. The ventilation cleaning holes 35 may be disposed on the two side surfaces of the mounting hole 32 and disposed with the via holes 33 at intervals between each other.

The ventilation cleaning holes are adapted for air flowing, and draining rain water and dirt. The gap between heat radiating fins and two side surfaces of the heat radiating base plate may be further adopted on one hand to introduce cold air from outside of the streetlight heat radiating device into the passive heat radiator, make the air flow through the heat radiating fins so as to improve heat radiating performance, and on the other hand to wash out dust and dirt coming from atmosphere by rain water obtained from rainfall, remove the dirt away from the streetlight heat radiating device via the ventilation cleaning holes. Therefore, the streetlights themselves adopting the streetlight heat radiating device of the present embodiment have ability of self-cleaning and good ventilation to facilitate heat radiating.

In the streetlight heat radiating device of the present invention, connection way of the passive heat radiator and the mounting seat of the streetlight lamp cap is not only limited to inserting and compression jointing, and may be another way, such as the heat radiating base plate and the mounting seat are fixed and connected by way of being embedded with each other by setting shapes and relative positions of the mounting seat and the heat radiating base plate of the passive heat radiator to make the shapes match with each other.

Embodiment 3 of the Streetlight Heat Radiating Device

Figure 16:
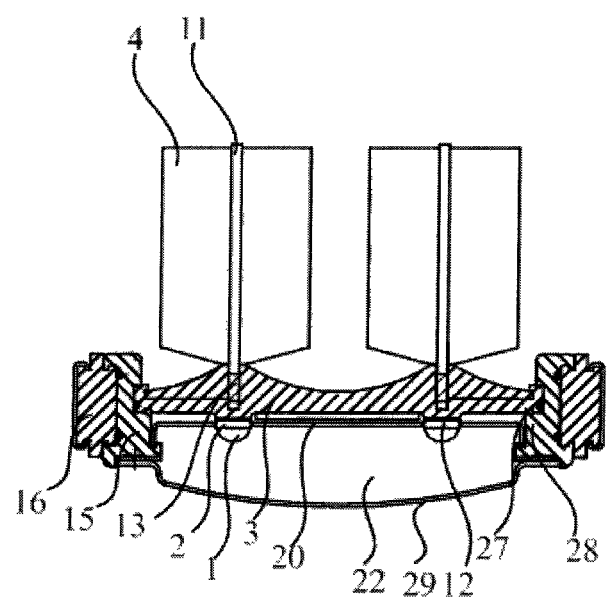
Figure 17:
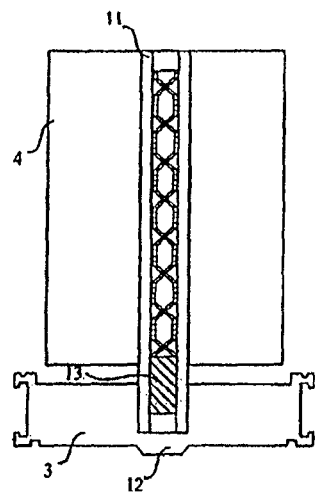

As shown in FIG. 16, it is a structure schematic view of Embodiment 3 of the streetlight heat radiating device in the present invention. The present embodiment may be based on the above Embodiment 1 or 2 with difference that no sealing cover 17 is disposed so that the upstanding plate and the heat radiating fins 4 of the passive heat radiator both expose to atmosphere for direct heat radiating. During specific mounting, screw holes or slots may be reserved on the connecting seat 16 in advance so as to be directly mounted onto a lamppost. In this streetlight heat radiating device, a lamp cap 29 may be further mounted. A lampstrip consisting of multiple bulbs 1 is mounted on the heat radiating base plate 3. The lamp cap 29 covers at the bottom of the heat radiating base plate 3 and surrounds at outside of the bulbs 1 to form sealing space.

The technical solution of the present embodiment can further simplify structure design of the streetlight heat radiating device so as to greatly reduce cost and processing time and facilitate promotion and application.

The passive heat radiator of the present invention is preferably applied in a streetlight, and more particularly suitable to form multiple heat radiating ending faces arranged in matrix on the heat radiating base plate. Bulb heat sources such as LEDs are mounted respectively to form a plane heat source relatively to the heat radiating base plate so as to transmit heat more evenly and get better heat radiating effect. During mounting the streetlight bulbs, an aluminum alloy plate may be mounted on the heat absorbing ending face for mounting bulb holders and streetlight bulbs. Alternatively, the aluminum alloy plate may also be used to manufacture the heat radiating base plate and the heat absorbing ending face thereof. A multi-layer circuit board may be layout in the area of the heat absorbing ending face. The streetlight bulbs are directly connected to the multi-layer circuit board by soldering. This direct connection may further omit heat transmitting layer and improve heat transmitting effect.

The passive heat radiator of the present invention may not only be used in streetlights, but may also be used in a variety of electric heat generating elements such as used in CPU for heat radiating. With continuous development of existing CPU technology, CPU using 45-nanometer chip technology proposes higher requirements to the heat radiating structure because of miniaturization characteristics. The passive heat radiator of the present invention is especially adapted to the situation acquiring flexible mounting position of heat radiating structure.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the scope of the present invention and covered in the claims of the present invention.

What is claimed is:

1. A passive heat radiator, comprising:
a heat radiating base plate;
a sealing housing connected to the heat radiating base plate;
a heat absorbing ending face disposed at one side of the heat radiating base plate deviated from the sealing housing, and adapted to mount a heat generating element; and
heat radiating fins connected to the sealing housing;
wherein the sealing housing comprises:
a slablike upstanding plate defining a cavity and connected to the heat radiating base plate;
a wick disposed in the cavity of the sealing housing, wherein the cavity is under vacuum and poured with liquid working substance having heat evaporation characteristics and at least a portion of the wick is impregnated with the liquid working substance; and
a supporting component disposed in the cavity in the sealing housing, adapted to eliminate deformation of the sealing housing due to pressure generated by external atmosphere and evaporation of the liquid working substance on the sealing housing.

2. The passive heat radiator according to claim 1, wherein when the heat radiating base plate and the slablike upstanding plate are mounted in use;
the slablike upstanding plate is perpendicular to or having a first angle greater than 60 degrees with a horizontal plane;
the heat radiating fins are perpendicular to or having a second angle greater than 60 degrees with the horizontal plane.

3. The passive heat radiator according to claim 1, wherein the supporting component is connected to an inner side surface of the sealing housing by soldering.

4. The passive heat radiator according to claim 1, wherein a cross section shape of the heat radiating base plate is approximate isoscelestriangle, a top angle of the approximate isoscelestriangle is connected with a bottom end of the upstanding plate, and a gap for ventilation is disposed between two sides of the approximate isoscelestriangle and the heat radiating fins.

5. The passive heat radiator according to claim 4, wherein two sides of the approximate isoscelestriangle are curved toward a bottom surface of the heat radiating base plate.

6. The passive heat radiator according to claim 1, wherein the heat absorbing ending face is a lug boss or a notch disposed on the heat radiating base plate.

7. The passive heat radiator according to claim 1, wherein a groove and/or a projection is disposed at the side of the heat radiating base plate and is adapted to be mutually engaged and inserted by concave and convex with a projection and/or a groove at the edge of a connecting attachment.

8. The passive heat radiator according to claim 1, wherein the heat radiating fins are parallel with each other and perpendicularly connected to an outer surface of the slablike upstanding plate by soldering.

9. The passive heat radiator according to claim 8, wherein the sealing housing is connected to the heat radiating base plate by soldering and in contact with the heat radiating base plate along the entire length of the heat radiating base plate.

10. The passive heat radiator according to claim 1, wherein a bottom portion of the sealing housing is inserted into an upper surface of the heat radiating base plate, and the wick is disposed in a bottom portion of the sealing housing adjacent to the heat absorbing ending face.

11. The passive heat radiator according to claim 10, wherein the upper surface of the heat radiating base plate comprises two curved portions symmetric about a central axis along the length of the heat radiating base plate, the two curved portions are curved toward a bottom surface of the heat radiating base plate, and a space between the curved portions and a bottom of the heat radiating fins defines a tapered air channel to enhance the air circulation in channels between the heat radiating fins.

* * * * *